(12) United States Patent
Shin et al.

(10) Patent No.: US 6,399,488 B2
(45) Date of Patent: Jun. 4, 2002

(54) METHOD OF MANUFACTURING A CONTACT PLUG IN A SEMICONDUCTOR DEVICE

(75) Inventors: Dong Suk Shin; Woo Seok Cheong, both of Ichon-shi; Bong Soo Kim, Seoul, all of (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/879,555

(22) Filed: Jun. 12, 2001

(30) Foreign Application Priority Data

Jun. 27, 2000 (KR) .............................. 00-35680

(51) Int. Cl.[7] .............................................. H01L 21/44
(52) U.S. Cl. ....................... 438/675; 438/647; 438/660; 438/763
(58) Field of Search ................. 438/675, 647, 438/657, 659, 660, 674, 763, 796; 117/8

(56) References Cited

U.S. PATENT DOCUMENTS

| 5,378,652 A | * | 1/1995 | Samata et al. | 438/647 |
| 5,753,555 A | * | 5/1998 | Hada | 117/9 |
| 5,879,447 A | * | 3/1999 | Okada et al. | 117/8 |
| 6,030,894 A | * | 2/2000 | Hada et al. | 438/675 |

* cited by examiner

Primary Examiner—Howard Weiss
Assistant Examiner—Timothy Sutton
(74) Attorney, Agent, or Firm—Marshall, Gerstein, & Borun.

(57) ABSTRACT

A method of manufacturing a contact plug in a semiconductor device is disclosed. In-situ thermal doping of an impurity such as phosphorous (P) during the process by which polysilicon for a contact plug is formed by selective growth method and after in-situ doping after the growth process is employed in order to increase the concentration of the impurity in the contact plug. As a result, the disclosed method can reduce the interfacial resistance at the plug to improve the electrical characteristics of a device of more than 1 G bits.

6 Claims, 1 Drawing Sheet

METHOD OF MANUFACTURING A CONTACT PLUG IN A SEMICONDUCTOR DEVICE

BACKGROUND OF THE INVENTION

1. Field of the Invention

The invention relates generally to a method of manufacturing a contact plug in a semiconductor device. More particularly, the present invention relates to a method of manufacturing a contact plug in a semiconductor device, which can reduce the resistance of a contact plug by preventing reduction in the impurity concentration of the contact plug formed by selective epitaxial growth (SEG) method.

2. Description of the Prior Art

Using a plug select growth technology in a semiconductor device has been highly appreciated in view of reduction in cell size and simplification of process. In developing a DRAM device of more than 1 G bits, however, in order to use the SEG process for forming a bit-line contact and a capacitor storage contact, the process condition are critical.

In a DRAM device of more than 1 G bits, it is difficult to apply polysilicon that has been usually used as a contact plug since its contact area is miniaturized. As the area of the contact is reduced, the contact resistance is further increased. Thus, there is a difficulty in using polysilicon as a contact plug. In other words, in case of using a plug SEG that is grown in the same single crystal to the silicon substrate, an increase in resistance depending on reduction in the contact area can be prohibited by minimizing an interfacial resistance with the silicon.

In case of SEG, however, phosphorous (P) is not doped by more than 1E20 atoms/cc, whereas the doping concentration of phosphorous (P) is more than 1E21 atoms/cc in polysilicon. This will cause increase in resistance when the SEG plug process is actually used.

SUMMARY OF THE DISCLOSURE

The disclosed method is a method of manufacturing a contact plug in a semiconductor device capable of improving an electrical characteristic of the device, by which an impurity such as phosphorous (P) is thermally doped in-situ to increase the concentration of the impurity during the process of forming a contact plug by SEG method and after it is formed, in order to prevent an increase in resistance due to reduction in the impurity concentration of a contact plug formed by SEG method.

The disclosed method comprises the steps of growing a SEG contact plug on a semiconductor substrate in which various components for forming a semiconductor device is formed by means of selective growth method, thermally doping the impurity during when the SEG contact plug is grown, and thermally doping the impurity after the SEG contact plug is grown.

In the above step, the SEG contact plug is formed using a polysilicon layer. The thermal doping is performed using $H_2$ and $PH_3$ gas at a temperature ranging from about 800° C. to about 950° C. under a pressure ranging from about 20 Torr to about 200 Torr. The $PH_3$ gas is diluted by about 1% to about 10% using $H_2$ gas and is then supplied at a flow rate ranging from about 100 sccm to about 5000 sccm. The input flow of said $H_2$ gas ranges from about 1 slm to about 10 slm.

The thermal doping during when the contact plug is formed is implemented after an initial contact plug formation to an initial thickness ranging from about 100 Å to about 500 Å by means of the selective growth method.

BRIEF DESCRIPTION OF THE DRAWINGS

The aforementioned aspects and other features of the disclosed method will be explained in the following description, taken in conjunction with the accompanying drawings, wherein.

DETAILED DESCRIPTION OF THE PRESENTLY PREFERRED EMBODIMENTS

Figure 1A:
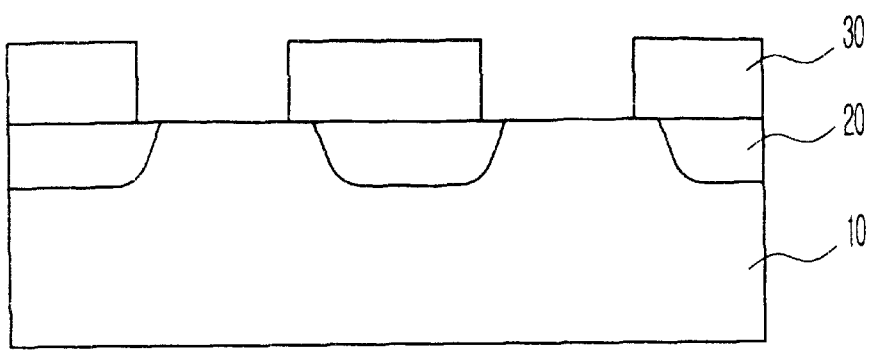
FIGS. 1A to 1C are cross-sectional views for explaining a method of manufacturing a contact plug in a semiconductor device according to the disclosed method.

The disclosed method will be described in detail by way of a preferred embodiment with reference to accompanying drawings, in which like reference numerals are used to identify the same or similar parts.

Figure 1B:
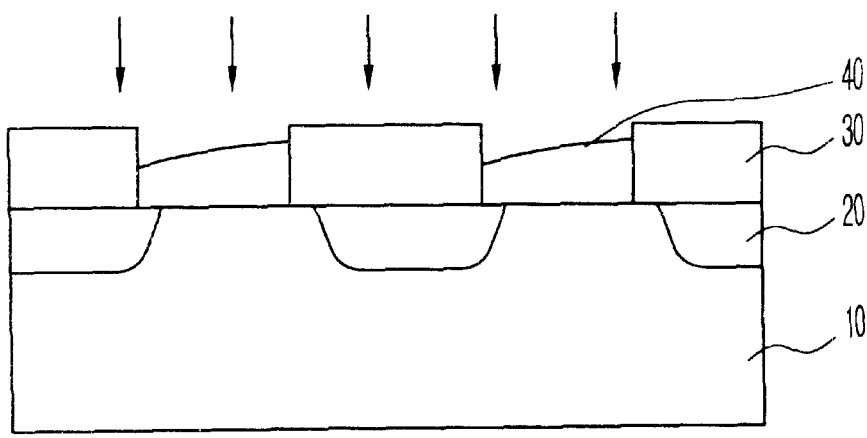
Figure 1C:
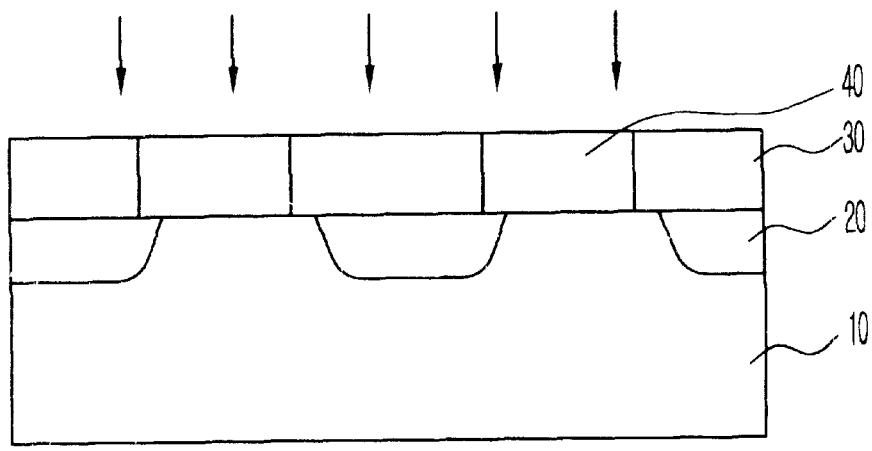

FIGS. 1A to 1C are cross-sectional views for explaining a method of manufacturing a contact plug in a semiconductor device according to the disclosed methodology.

Referring now to FIG. 1A, an interlayer insulating film 30 is formed on a semiconductor substrate 10 in which a device separation film 20 is formed. Then, the interlayer insulating film 30 is patterned to expose the junction surface of the semiconductor substrate 10, thus forming a contact hole.

Referring now to FIG. 1B, impurity is thermally doped into a SEG silicon layer for contact plug 40 while the SEG silicon layer for contact plug 40 is grown on the exposed surface of the semiconductor substrate 10. The thermal doping is performed when the SEG silicon layer for contact plug has been initially grown to a thickness ranging from about 100 Å to about 500 Å and is performed using $PH_3$ and $H_2$ gases at a temperature ranging from about 800° C. to about 950° C. under a pressure ranging from about 20 Torr to about 200 Torr. The inlet flow rate of the $H_2$ gas is in the range of about 1 SLM to about 10 SLM. The $PH_3$ gas is supplied in a flow rate ranging from about 100 sccm to about 5000 sccm by diluting the $H_2$ gas by about 1% to about 10%.

Resistance of an initially grown SEG polysilicon layer may increase due to defects. However, as the initially grown SEG polysilicon layer is thermally doped, resistance at the portion in which the SEG polysilicon layer contacts silicon can be minimized.

Referring now to FIG. 1C, the SEG silicon layer for contact plug is completely grown to fill the contact hole formed in the interlayer insulating film 30. Then, the thermal doping performed in FIG. 1B is performed again.

Generally, the concentration of phosphorous (P) in polysilicon is $1\times10^{21}$ atoms/cc, but the impurity concentration of the SEG polysilicon layer that is grown for forming a contact plug is more than $1\times10^{20}$ atoms/cc. Thus, the SEG polysilicon layer will not be doped. This phenomenon acts to increase the resistance in the contact plug, thus causing the operation to degrade and, consequently performance of the device. By implementing the thermal doping to implant the impurity during when the SEG polysilicon layer for contact plug 40 is grown and after it was grown, the disclosed method prevents an increase in the resistance components by reducing the impurity concentration.

The process for compensating for the impurity concentration by implementing the thermal doping during when the SEG polysilicon layer is grown and after it was grown, may be applied to a process, which employs various contact plugs such as a bit line contact plug in a memory device or a storage electrode contact plug in a capacitor.

As mentioned above, the disclosed method can improve an electrical characteristic of a device by in-situ doping of the impurity during the process by which polysilicon for contact plug is grown by SEG method to form a contact plug and after the process, thus reducing the resistance.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed:

1. A method of manufacturing a contact plug in a semiconductor device, comprising:

forming a first portion of a SEG contact plug by means of a selective growth method to fill a portion of a contact hole disposed on a semiconductor substrate;

thermally doping the first portion of the SEG contact plug with an impurity during the step of forming the first portion of the SEG contact plug;

forming a second portion of the SEG contact plug on the first portion by means of a selective growth method to fill the contact hole;

thermally doping the SEG contact plug with an impurity after the second portion of the SEG contact plug is formed.

2. The method of manufacturing a contact plug in a semiconductor device according to claim 1, wherein said first and second portions of the SEG contact plug are formed using a polysilicon layer.

3. The method of manufacturing a contact plug in a semiconductor device according to claim 1, wherein at least one of said thermal doping steps is performed using $H_2$ and $PH_3$ gas at the temperature ranging from about 800° C. to about 950° C. under a pressure ranging from about 20 Torr to about 200 Torr.

4. The method of manufacturing a contact plug in a semiconductor device according to claim 3, wherein said $PH_3$ gas is diluted by about 1% to about 10% with $H_2$ gas and the diluted $PH_3$ gas is then supplied at a flow rate ranging from about 100 sccm to about 5000 sccm.

5. The method of manufacturing a contact plug in a semiconductor device according to claim 3, wherein an input flow of said $H_2$ gas ranges from about 1 slm to about 10 slm.

6. The method of manufacturing a contact plug in a semiconductor device according to claim 1, wherein the thermal doping during when said contact plug is formed is implemented after an initial formation of the contact plug to an initial thickness ranging from about 100 Å to about 500 Å by means of a selective growth method.

* * * * *